United States Patent [19]
Bohm et al.

[11] Patent Number: 4,757,363
[45] Date of Patent: Jul. 12, 1988

[54] ESD PROTECTION NETWORK FOR IGFET CIRCUITS WITH SCR PREVENTION GUARD RINGS

[75] Inventors: Michael A. Bohm; W. Ronald Young, both of Palm Bay, Fla.

[73] Assignee: Harris Corporation, Melbourne, Fla.

[21] Appl. No.: 914,524

[22] Filed: Oct. 3, 1986

Related U.S. Application Data

[63] Continuation of Ser. No. 650,549, Sep. 14, 1984, abandoned.

[51] Int. Cl.[4] .......................................... H01L 29/78
[52] U.S. Cl. .................................. 357/23.13; 357/13; 357/52
[58] Field of Search ................. 357/23.13, 42, 52, 34, 357/13, 134

[56] References Cited

U.S. PATENT DOCUMENTS

| | | | |
|---|---|---|---|
| 3,226,613 | 12/1965 | Haenichen | 357/13 X |
| 3,534,231 | 10/1970 | Biard | 357/52 X |
| 3,590,340 | 6/1971 | Kubo et al. | |
| 3,667,009 | 5/1972 | Rugg | 357/23.13 X |
| 3,673,428 | 6/1972 | Athanas | |
| 3,739,238 | 6/1973 | Hara | 357/13 |
| 3,748,547 | 7/1973 | Sugimoto | |
| 3,934,159 | 1/1976 | Nomiya et al. | |
| 3,967,295 | 6/1976 | Stewart | 357/42 X |
| 4,066,918 | 1/1978 | Heuner et al. | |
| 4,100,561 | 7/1978 | Ollendorf | 357/42 X |
| 4,131,908 | 12/1978 | Daub et al. | |
| 4,135,955 | 1/1979 | Gasner et al. | 357/42 X |
| 4,143,391 | 3/1979 | Suzuki et al. | |
| 4,173,767 | 11/1979 | Stevenson | 357/42 X |
| 4,189,739 | 2/1980 | Copeland, III | |
| 4,261,004 | 4/1981 | Masuhara et al. | |
| 4,264,941 | 4/1981 | London | 357/13 |
| 4,305,085 | 12/1981 | Jaecklin et al. | 357/52 X |
| 4,476,476 | 10/1984 | Yu et al. | 357/23.13 X |
| 4,476,479 | 10/1984 | Saito | 357/42 X |

FOREIGN PATENT DOCUMENTS

| | | | |
|---|---|---|---|
| 55-91171 | 7/1980 | Japan | 357/23.13 |
| 0090970 | 5/1982 | Japan | 357/23 GP |
| 0190360 | 11/1982 | Japan | 357/23.13 |
| 0038890 | 3/1983 | Japan | 357/42 |
| 0034958 | 11/1983 | Japan | 357/23 GP |

OTHER PUBLICATIONS

Clemen, R., Haug, W., and Schnadt, R., "Lateral Transistors as Active Guard Ring in FET Circuits", IBM Technical Disclosure Bulletin, vol. 18, No. 2, Jul. 1975.

Primary Examiner—Andrew J. James
Assistant Examiner—S. Crane
Attorney, Agent, or Firm—Barnes & Thornburg

[57] ABSTRACT

An input resistor-diode protection circuit having an input resistor formed by a high impurity region within a deeper low impurity region, both a first conductivity type and input diode formed by the junction of the low impurity resistor region and the substrate along a substantial portion and a high impurity region overlapping the low impurity region at the output end of the resistor-diode circuit, both of a second conductivity type. A bipolar transistor connected to the output of the resistor in parallel to the diode also provides protection. A pair of concentric guard rings of first and second conductivity type laterally encompasses the input protection circuit.

10 Claims, 2 Drawing Sheets

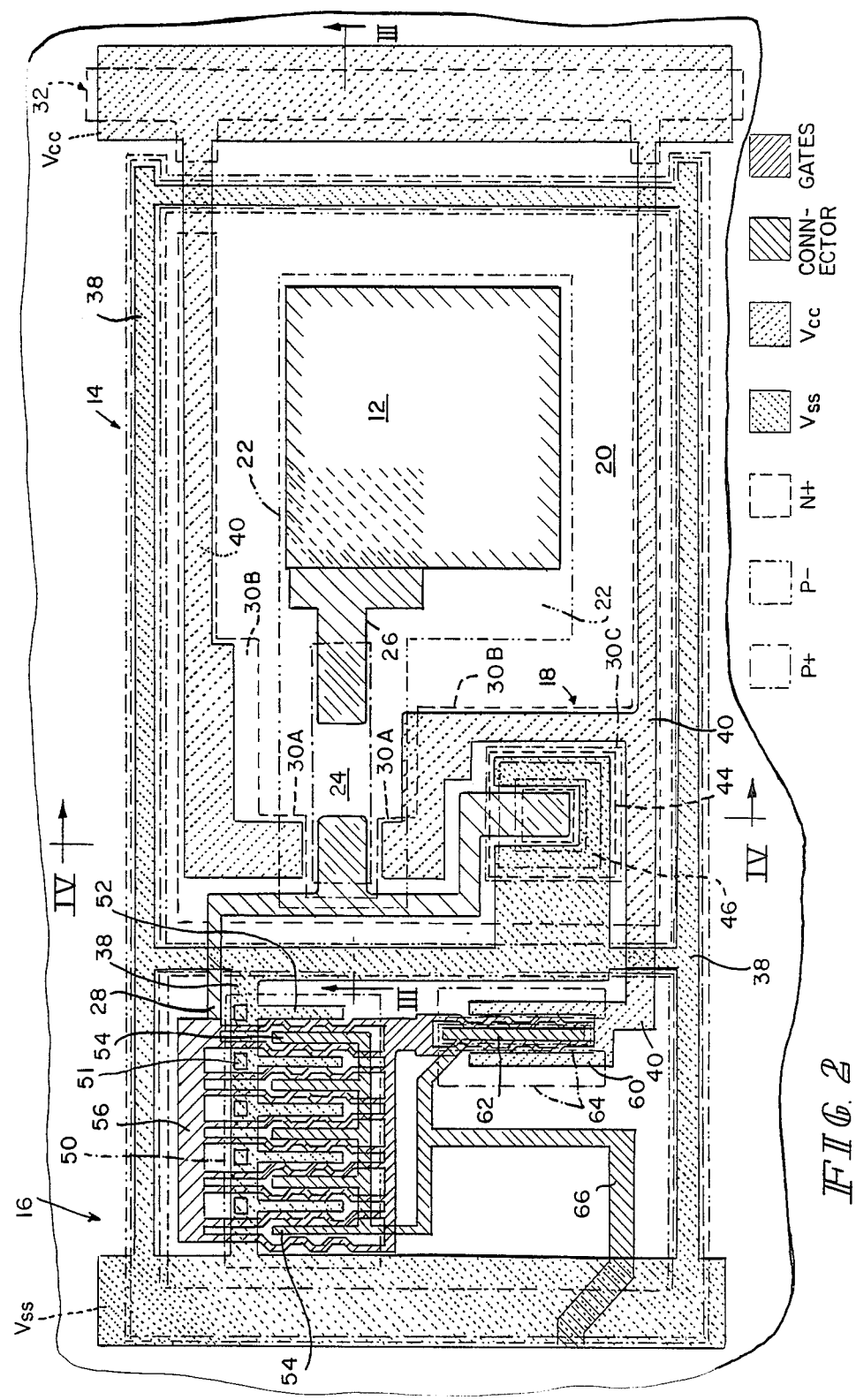

ESD PROTECTION NETWORK FOR IGFET CIRCUITS WITH SCR PREVENTION GUARD RINGS

This is a continuation of application Ser. No. 650,549, filed Sept. 14, 1984, now abandoned.

BACKGROUND AND SUMMARY OF THE INVENTION

The present invention relates generally to input protection circuits and more specifically to an improved electrostatic discharge protection network for insulated gate field effect transistor circuits.

The occurrence of spikes, noise or other high voltage undesirable signals on the input of transistor circuits are well known. The prior art has attempted to provide protection for these circuits by using a resistor-diode input protection circuitry. If the transistors to be protected are formed in an N-type substrate for example, a P-type diffused resistor is formed in the N-type substrate and connected between the input to the transistors and the input to the circuit. The P-type resistor forms a PN junction with the substrate. By the use of a single diffused resistor, the input resistance as well as the breakdown voltage of the diode is determined by the same diffusion.

Attempts have been made to distribute the resistance and breakdown voltage between the input and the output end of the resistor by placing a higher impurity concentration N region at the output side of the resistor. A typical example is in U.S. Pat. No. 3,748,547. The placement of the increased impurity N region is critical since its distance from the input is used to define the breakdown voltage as a function of the spread of the depletion region. Other attempts at lowering the breakdown voltage of the resistor-diode input circuit using P+ and N+ contacts to a P− resistor is described in U.S. Pat. No. 3,673,428. By using a P− resistor to effectuate both of the breakdown adjustments, the resistor has poor temperature coefficient and therefore is undesirable. Similarly, there is no SCR protection from the ground diode 30 which causes latch-up of the circuit.

A resistor-diode input protection circuit which addresses the problem of latch-up is described in U.S. Pat. No. 4,143,391. An SCR Q5 and Q6 is intentionally formed at the output side of the input resistor. By designing the circuit without a resistor at the base of Q5, the SCR will not latch up. To prevent the formation of an SCR between the input resistor and the well in which one of the complementary transistors is formed, the base region of transistors Q7 and Q8 are formed to a large enough length to produce a low current amplification factor Beta. Thus, the elements in this circuit must be at specific locations and distances and thereby limit the circuit design.

Although addressing single portions of the input protection circuit, the prior art has failed to address substantially all the issues involved in designing a resistor-diode input protection circuit.

Thus, it is an object of the present invention to provide an improved resistor-diode input protection circuit which addresses substantially more of the desired characteristics than the prior art.

Another object of the present invention is to provide a resistor-diode input circuit having a high breakdown voltage-high resistance input portion and a low breakdown voltage-low series on resistance at its output portion.

Still another object of the present invention is to provide an improved resistor-diode input circuit which prevents SCR formation and latch-up while allowing the designer freedom in the circuit layout.

A further object of the present invention is to provide a resistor-diode input protection circuit wherein the series resistance and the breakdown voltage may be separately optimized.

An even further object of the present invention is to provide a resistor-diode input protection circuit having a low input capacitance.

These and other objects of the present invention are attained by forming the input resistor of two diffused regions with the higher impurity concentration region being formed in a deeper and wider low impurity concentration diffused region. This allows the high impurity concentration region to define the series resistance of the input resistor and the low impurity region to substantially define the breakdown characteristic of the input diode. A high impurity concentration of the same conductivity type as the substrate extends into the low impurity concentration of the resistor at the output or transistor side of the resistor diode input circuit, to provide a low breakdown voltage-low series resistor-diode combination at the transistor side. This increased impurity concentration region of the same impurity type as the substrate extends adjacent to and substantially along the remainder of the low impurity concentration portion of the resistor region.

A first guard ring having an impurity concentration opposite that of the substrate completely surrounds the resistor-diode input protection circuit and isolates it from the transistor device to which it is a protection device. The first guard ring includes a deep low impurity concentration region in which is formed a higher impurity concentration region of the same conductivity type. A second guard ring of a higher impurity concentration than and the same conductivity type as the substrate is formed laterally separating the input protection circuitry and the transistor to which it is protecting. The second guard ring is interior the first guard ring. First and second surface conductors make contact with substantial portions of the first and second guard rings respectively. The resistor-diode input circuitry also includes a vertical bipolar transistor of which the substrate is a collector and including a collector contact which is part of the second guard ring and completely encompasses the base of the vertical bipolar transistor.

Other objects, advantages and novel features of the present invention will become apparent from the following detailed description of the invention when considered in conjunction with the accompanying drawings.

BRIEF DESCRIPTION OF THE DRAWINGS

FIG. 2 is a plan view of an integrated circuit incorporating the principles of the present invention.

DETAILED DESCRIPTION OF THE DRAWINGS

Figure 1:
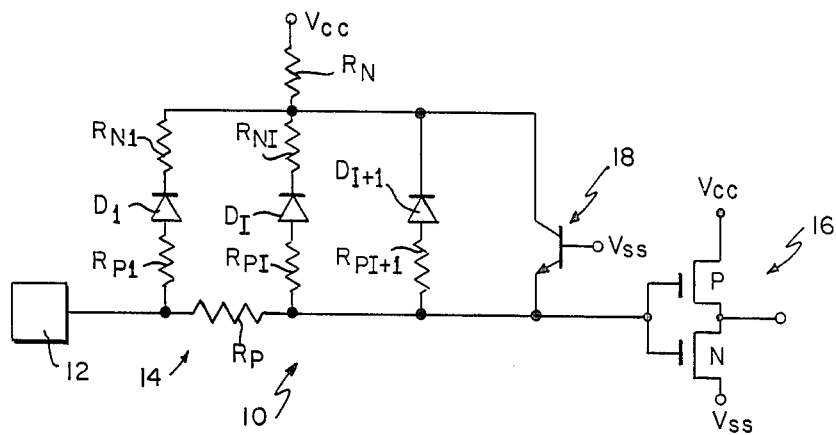
FIG. 1 is a schematic of an input circuit according to the principles of the present invention.

The input protection circuit of the present invention for an insulated gate field effect transistor inverter is illustrated in FIG. 1 as a circuit 10. The input is from a bonding pad 12 through a resistor-diode protection circuit 14 to the input gates of a complementary insulated gate field effect transistor inverter 16. It should be noted that although the present invention will be described as built in an N substrate, the notations are not limiting and the device and circuitry may be formed in a P substrate wherein all the P and N notations are reversed. The input series resistor RP of the resistor-diode protection circuit 14 is connected to a first voltage source VCC throug a plurality of parallel resistor-diode combinations. The diodes D1 through DI+1 have an input series resistance RP1 through RPI+1 to the series input resistor RP and D1 through DI have an output series resistance RN1 through RNI. The contact resistance to VCC is illustrated as resistor RN. Also connected in parallel to the parallel diodes D1 through DI+1 is a NPN transistor 16 having its emitter connected to the output side of the series resistor RP, its base connected to a second voltage source VSS and its collector connected to the first voltage source VCC through the contact resistance RN.

As will be explained more fully with reference to the remaining figures, the diodes D1 through DI+1 are not individual and distinct diodes, but the distributive diode across the junction of the series input resistor RP and resistors RP1 through RPI+1 and the location of the VCC contact resistance RN. The series resistance RP is selected to have a low temperature coefficient and the plural resistances RP1 through RPI+1 are designed to produce a low input capacitance. The diodes D1 through DI are selected to have a high breakdown voltage and series diode-resistance while the diode DI+1 at the output end of the series resistor has a low breakdown voltage and no additional series diode-resistance between the diode and the VCC contact resistance RN.

Figure 3:
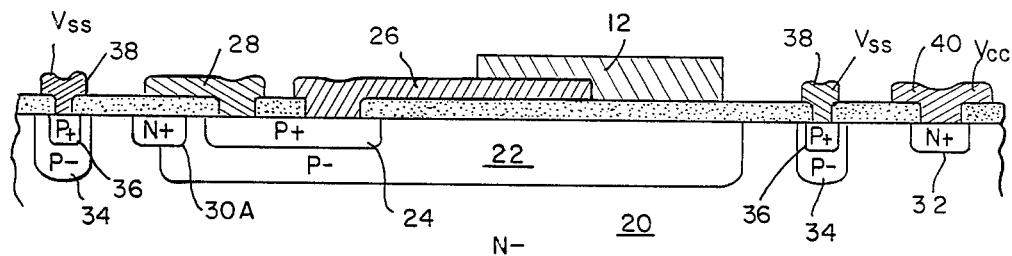
FIG. 3 is a cross-sectional view taken along lines III—III of FIG. 2.
Figure 4:
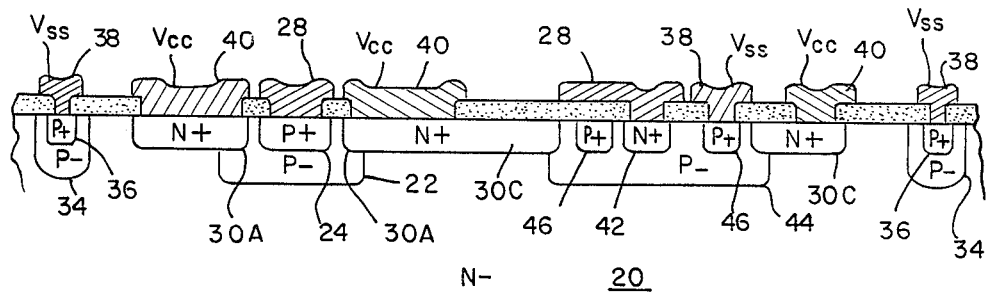
FIG. 4 is a cross-sectional view taken along lines IV—IV of FIG. 2.

The integrated circuit including the input protection circuit and the complementary insulated gate field effect transistors is illustrated in FIGS. 2, 3 and 4. The distributive resistors RP1 through RPI+1 is formed by a P− region 22 and an N− substrate 20 and the series resistance is formed by a P+ region 24 formed in the P− region 22. Conductor 26 connects the bonding pad 12 to an input side of P+ resistive region 24 and conductor 28 is connected to the output or transistor side of resistive region 24. An N+ contact region and guard ring 30 in combination with N+ region 32 completely laterally encompass the input protection circuit 14. The N+ region 30 includes a region 30a which extends into the P− region 22 and encompasses at least three sides of the portion of the P+ resistor 24 at the contact area of conductor 28. Extending therefrom is portion 30b which extends substantially along the remainder of the length of the resistive region 24 spaced from the P+ region 24 and P− region 22.

The impurity concentration of region 30 defines the common resistance RN. The portions of the N− substrate 20 between the P− region 22 and the N+ region 30b are represented by the resistances RN1 through RNI. Because portion 30a extends into the P− region 22, there is no series resistance RNI+1. The breakdown voltage of diodes D1 through DI is a function of the impurity concentration of P− region 22 and its junction with N− substrate 20 in combination with the spacing of the N+ region 30b. The breakdown of diode DI+1 is defined by the N+ region 30a and the P− region 22. By using a P− region 22 having an impurity concentration in the range of $1 \times 10^{16}$ to $2 \times 10^{16}$ atoms per cubic centimeter, the N+ region having an impurity concentration of $1 \times 10^{20}$ to $5 \times 10^{20}$ atoms per cubic centimeter and an N− substrate 20 having an impurity concentration of $1 \times 10^{15}$ to $2 \times 10^{15}$, the diodes D1 through DI have a breakdown voltage in the range of 80 volts to 120 volts and the diode DI+1 has a breakdown voltage in the range of 25 volts to 35 volts. The resistance RP1 through RPI+1 have a value in the range of 2000 ohms per square to 6000 ohms per square, the resistance RN1 through RNI have a resistivity in the range of 3 ohm-centimeters to 5 ohm-centimeters and the resistance RN has a resistance in the range of 25 ohms per square to 45 ohms per square. For a P+ region 24 having an impurity concentration in the range of $2 \times 10^{19}$ to $3 \times 10^{19}$ atoms per cubic centimeter, the resistance 24 will have a value in the range of 150 ohms per square to 490 ohms per square. Thus, it can be seen that the diodes D1 through DI have a substantially higher breakdown voltage and larger associated diode-resistance than diode DI+1 and its associated diode-resistance.

Also encompassing the input protection circuit 14 is a P− guard ring 34 in which is formed a P+ guard ring 36. This is connected to an interconnect 38. One of the main functions of the N+ guard ring 30 and the P+, P− guard ring 36, 34 is to prevent the formation of four layer devices which cause latch-up as well as other parasitic bipolar transistors. These devices generally include a lateral bipolar transistor including the P− region 22, the N− substrate 20 and P regions of the insulated gate field effect transistor circuitry which include either P+ source and drains or the P− well in which the N channel devices are formed. The most critical protection is preventing the turn-on of the four layer device formed with the P− well of the N channel device. The P+, P− guard ring collects lateral carriers from the input structure and prevent their transmission to the insulated gate field effect transistor portion of the substrate 16. By providing the N+ contact region close to the contact region for the interconnect 28 of the resistor and to the substrate region 20, the voltage drop of the series resistance of the output diode and the collector contact are substantially reduced thereby maintaining the substrate at substantially the reference voltage VCC. The lateral PNP parasitic transistor is prevented from turning on by minimizing the NPN collector voltage drop, which is the base of the lateral PNP.

By using a P+ region to form the resistive region 24 and the P− region 22 to define the breakdown characteristics of the diodes, both of these regions may be optimized. Similarly, the low impurity P− region 22 provides low input capacitance. The high impurity concentration P+ region 24 has a low temperature coefficient to give a constant resistance across the operable temperature range. Also, the P− region 22 and 34 prevent pitting or contact metal from migrating into the N− region 20 to short the diode junction. It should also be noted that the P− guard ring 34 is the same depth as the P− well of the N channel device. This adds to the efficiency of the guard ring in collecting lateral carriers. The P− region 22 is sufficiently wide and deep to prevent the P+ resistive region 24 from having effect on the breakdown voltage defining the diodes D1 through DI+1.

Conductor 38 connects the P+ region 36 to voltage source VSS while conductor 40 connects N+ regions 30 and 32 to the voltage source VCC. The conductors 40 and 38 extend over a substantial portion of the N+ regions 30 and 32 and the P+ guard ring 36 respectively and makes contact substantially along the entire width and length of the guard rings. Again, this reduces the series resistance of the guard rings so as to minimize the voltage drop in the guard rings.

The input protection transistor 18 includes an N+ emitter region 42 formed in a P— base region 44 with the N— substrate 20 forming the collector. A P+ base contact ring 46 is formed in the P— base region 44. A portion 30c of the N+ region 30 laterally encompasses and extends into the P— base region 44 and forms the collector contact. This reduces the collector series resistance and lowers the collector to base breakdown voltage. The emitter region 42 is connected to interconnect 28 which is connected to the output region of input resistor RP and region 24 which in turn is connected to the input of the inverter 16. Thus, as can be seen, the N+ guard region 30 and the P+, P— guard ring 34 and 36 completely encompass the input resistor-diode protection circuit 14 and bipolar transistor 18.

As illustrated in FIG. 2, the complementary insulated gate field effect transistor portion 16 includes P— well 50 in which an N channel device is formed having source contacts 52 and P+ body contact 51 connected to the VSS line 38, drain contacts 54, and gates 56 connected to resistor output interconnect line 28. The P channel device includes source contacts 60 connected to VCC line 40, drain contacts 62 connected to drain contacts 54 of the N channel device and gates 64 is connected to the gates 56 of the N channel device. Drains 54 and 62 are connected as an output by conductor 66.

The operation of the input circuit to offer protection against both directions of noise will now be explained. When the input on pad 12 is positive with respect to VCC by at least 0.7 volts, the diodes of the resistive-diode circuit 14 are forward biased thereby clamping the input to no greater than 40 volts above VCC. When the input is negative with respect to VCC by at least 20 volts, the diodes of the resistor diode combination are reversed biased and breakdown to clamp the excursion to no greater than 40 volts less than VCC. With respect to the operation of bipolar transistor 18, it provides protection for excursions relative to VSS which is generally ground. When the input is negative with respect to VSS, the base-emitter junction is forward biased operating as a transistor and provides a current source to balance the incoming current and hold it within a specific level. When the input is positive with respect to VSS, the emitter-base junction operates as a zener diode and breaking down thereby conducting the current away from the input terminal. Conduction in the transistor is both zener diode current due to the emitter-base breakdown and transistor action of the transistor operated in the inverted mode, second breakdown. Second breakdown operation allows increased current for the same collector to emitter voltage. It should be noted by providing the high series resistance RP1 through RPI+1 as well as RN1 thorough RNI, the input voltage can fluctuate above and below VCC without adversely affecting the input to the insulated gate field effect transistor circuit 16.

From the preceding description of the preferred embodiments, it is evident that the objects of the invention are attained, and although the invention has been described and illustrated in detail, it is to be clearly understood that the same is by way of illustration and example only and is not to be taken by way of limitation. The spirit and scope of the invention are to be limited only by the terms of the appended claims.

What is claimed is:

1. In an integrated input protection circuit having at least one transistor to be protected having a first conductivity type region in a first portion of a substrate of a second conductivity type and an input resistor-diode means having a first conductivity type region in a second portion of said substrate and connected between a circuit input and said transistor, the improvement comprising:
    said resistor-diode means includes a resistor-diode and a vertical bipolar transistor having a base region of said first conductivity type separate from said first conductivity type region of said resistor-diode in said second portion of said substrate which forms a collector, an emitter region of said second conductivity type in said base region and connected to said transistor to be protected and a collector contact of said second conductivity type having a higher impurity concentration than said substrate's impurity concentration in said second portion of said substrate laterally encompassing and overlapping a portion of said base region;
    a first guard ring means of said first conductivity type in said substrate laterally encompassing said resistor-diode and bipolar transistor;
    a second guard ring means of said second conductivity type, having a higher impurity concentration than said substrate's impurity concentration, and being in said substrate laterally separating said first and second portions of said substrate;
    a first surface conductor making contact with a portion of said first guard ring means and said base region; and
    a second surface conductor making contact with a portion of said second guard ring means and said collector contact.

2. An integrated input protection circuit according to claim 1 wherein said second guard ring means is interior said first guard ring means.

3. An integrated input protection circuit according to claim 1 wherein said first guard ring means includes a first region of a first impurity concentration in said substrate and a second region of a second impurity concentration higher than said first impurity concentration in said first region.

4. An integrated input protection circuit according to claim 3 including a first surface conductor making contact with a substantial portion of said first guard ring means and a second surface conductor making contact with a substantial portion of said second guard ring means.

5. An integrated input protection circuit according to claim 3 wherein said first region is substantially deeper than said second region.

6. An integrated input protection circuit according to claim 1 including said first surface conductor making contact with a substantial portion of said first guard ring means and said second surface conductor making contact with a substantial portion of said second guard ring means.

7. An integrated input protection circuit according to claim 1 wherein said transistor is an insulated gate field effect transistor having source and drain regions of said second conductivity type and contained in a body region of said first conductivity type and said first guard ring having an equal to or greater depth than said body region.

8. In an integrated input protection circuit having at least one transistor to be protected having a first conductivity type region in a first portion of a substrate of a second conductivity type and an input resistor-diode means having a first conductivity type region in a second portion of said substrate and connected between a circuit input and said transistor, the improvement comprising:

said input resistor-diode means includes a first region of said first conductivity type in said substrate and a second region of said first conductivity type, having a higher impurity concentration than said first region being in and separated from said substrate by said first region, said second region having input contact area and a transistor contact area, said first region of said resistor-diode means has sufficient width and depth compared to said second region to substantially prevent said second region from having an effect on the breakdown voltage of said resistor-diode means, a third region of said second conductivity type and having a higher impurity concentration than said substrate's impurity concentration in said substrate and in said first region adjacent only said transistor contact area;

a vertical bipolar transistor having a base region of said first conductivity type separate from said first region in said substrate which forms a collector, an emitter region of said second conductivity type in said base region and connected to said transistor contact area, and a collector contact of said second conductivity type having a higher impurity concentration than said substrate's impurity concentration and being in said substrate laterally encompassing and overlapping a portion of said base region to minimize the collector resistance and lower the collector to base breakdown voltage; and a first guard ring means of said first conductivity type in said substrate laterally encompassing said input resistor-diode means and said vertical bipolar transistor for preventing formation of a latch by said input resistor-diode means and vertical bipolar transistor and said transistor to be protected;

a second guard ring means of said second conductivity type, having a higher impurity concentration than said substrate's impurity concentration, and being in said substrate laterally separating said first and second portions of said substrate;

a first surface conductor making contact with a substantial portion of said first guard ring means and said base regions;

a second surface conductor making contact with a substantial portion of said second guard ring means and said collector contact.

9. An integrated input protection circuit according to claim 8 wherein said first guard ring means includes a first region of a first impurity concentration in said substrate and a second region of a second impurity concentration higher than said first impurity concentration in said first region.

10. An integrated input protection circuit according to claim 8 wherein said transistor is an insulated gate field effect transistor having source and drain regions of said second conductivity type and contained in a body region of said first conductivity type and said first guard ring having a equal to or greater depth than said body region.

* * * * *